(12) United States Patent
Morisaki et al.

(10) Patent No.: US 7,164,191 B2
(45) Date of Patent: Jan. 16, 2007

(54) LOW RELATIVE PERMITTIVITY SIO$_x$ FILM INCLUDING A POROUS MATERIAL FOR USE WITH A SEMICONDUCTOR DEVICE

(75) Inventors: Hiroshi Morisaki, Saitama (JP); Yasuo Imamura, Fukuoka (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/258,583

(22) PCT Filed: May 7, 2001

(86) PCT No.: PCT/JP01/03822

§ 371 (c)(1),
(2), (4) Date: Nov. 1, 2002

(87) PCT Pub. No.: WO01/86707

PCT Pub. Date: Nov. 15, 2001

(65) Prior Publication Data

US 2003/0143834 A1 Jul. 31, 2003

(30) Foreign Application Priority Data

May 8, 2000 (JP) .............................. 2000-135019
Aug. 16, 2000 (JP) .............................. 2000-246605

(51) Int. Cl.
*H01L 23/58* (2006.01)

(52) U.S. Cl. ...................... 257/650; 257/632; 257/758; 257/E23.077; 257/E23.167; 257/E21.494; 438/632; 438/787

(58) Field of Classification Search ................ 427/489, 427/789, 96.8; 438/787, 789, 790, 788, 632, 438/625; 257/650, 489, 646, 632, 758, E23.077, 257/E23.167, E21.494
See application file for complete search history.

(56) References Cited

U.S. PATENT DOCUMENTS

| 5,371,047 | A | * | 12/1994 | Greco et al. ................ 438/623 |
| 5,547,703 | A | * | 8/1996 | Camilletti et al. ....... 427/126.3 |
| 5,888,870 | A | * | 3/1999 | Gardner et al. ............. 438/261 |
| 6,242,366 | B1 | * | 6/2001 | Beekman et al. ........... 438/790 |
| 6,576,300 | B1 | * | 6/2003 | Berry et al. ................ 427/489 |
| 2002/0102413 | A1 | * | 8/2002 | Han et al. .................. 428/446 |
| 2002/0115308 | A1 | * | 8/2002 | Morisaki et al. ............ 438/787 |
| 2003/0180197 | A1 | * | 9/2003 | Nunan ........................ 422/177 |

FOREIGN PATENT DOCUMENTS

| EP | 0126803 | 12/1984 |
| EP | 0126803 A2 | 12/1984 |
| JP | 45-24655 | 8/1970 |
| JP | 7-76767 | 3/1995 |
| JP | 11-97533 | 4/1999 |
| JP | 11-97533 A | 4/1999 |
| JP | 11-289013 | 10/1999 |

* cited by examiner

*Primary Examiner*—George R. Fourson
*Assistant Examiner*—Julio J. Maldonado
(74) *Attorney, Agent, or Firm*—Oblon, Spivak, McClelland, Maier & Neustadt, P.C.

(57) ABSTRACT

A low relative permittivity SiO$_x$ film excellent in heat resistance without using an alkali metal, fluorine, etc., a method for modifying an SiO$_x$ film to accomplish a further reduction of the relative permittivity of the low relative permittivity SiO$_x$ film and further to increase the insulating property, a highly reliable semiconductor device free from crack or peeling of the film by employing the low relative permittivity SiO$_x$ film as an interlayer insulating film for metal wirings, are provided. The low relative permittivity film is characterized in that it is made of a porous material, the major constituent of which is SiO$_x$ (where $1.8 \geq X \geq 1.0$), and the relative permittivity at 1 MHz is at most 2.3.

6 Claims, 2 Drawing Sheets

Schematic diagram of semiconductor device

Conceptual diagram of cluster beam vapor deposition apparatus

LOW RELATIVE PERMITTIVITY SiO$_x$ FILM INCLUDING A POROUS MATERIAL FOR USE WITH A SEMICONDUCTOR DEVICE

TECHNICAL FIELD

The present invention relates to a low relative permittivity SiO$_x$ film particularly useful as an interlayer insulating film of a semiconductor device having e.g. LSI mounted, a method for its production, and a semiconductor device employing it.

BACKGROUND ART

For high integration of a semiconductor device, it is necessary to reduce the spacing between metal wirings (i.e. the spacing between local wirings, between global wirings, or between a local wiring and a global wiring). However, if the spacing between metal wirings is reduced, the wiring delay due to R (wiring resistance)×C (wiring capacity) will be dominant, whereby high speed operation of signals will be impaired. A schematic diagram showing a position for forming an interlayer insulating film of a semiconductor device, is shown in FIG. 1.

In order to solve such a problem, it has been attempted to reduce the wiring resistance or the wiring capacity, or both of them. For reduction of the wiring resistance, it has been studied, for example, to change the material from an Al material to a Cu material or an Au material which is a material having a lower resistance than the Al material. However, such a metal material is readily diffusible by the Si component of an Si chip, which brings about a new problem, such as necessity to form a barrier layer, which is now being studied.

On the other hand, for reduction of the wiring capacity, at the time of laminating the above metal wirings via an insulating layer so-called an interlayer insulating film, silica glass is usually employed as such an insulating film. However, with such an insulating film, the demand at present can not adequately be satisfied, and it has been proposed, for example, to further dope fluorine, to make the film porous, or to employ an organic insulating film.

For example, JP-A-1-235254 discloses a semiconductor device having metal wirings formed in multilayers via a porous insulating film, on a semiconductor substrate. This invention comprises depositing on a substrate an insulating film made of a mixture comprising a basic oxide such as sodium oxide or calcium oxide and an acidic oxide such as silicon dioxide or boron oxide, followed by heat treatment to precipitate or elute only the basic oxide or the acidic oxide to form pores in the film, whereby the reliability of the semiconductor device is substantially decreased by inclusion of e.g. the basic oxide.

JP-A-2000-21245 proposes a method for forming pores by using fine hollow polymer particles together with an organic silicon compound. However, use of an organic compound is insecure from the viewpoint of heat resistance and thus will substantially limit the process conditions in the subsequent process steps for the production of the semiconductor.

Further, JP-A-11-289013 discloses a method for forming a porous insulating film, which comprises evaporating metallic silicon in an oxygen-containing atmosphere. The insulating film formed by this method is one having a relative permittivity as small as at most 1.95, but in its film composition, SiO$_2$ is the main component, as disclosed in paragraph 0052 in the publication as "SiO$_2$ occupies the major portion, and the integral strength of the SiO$_x$ component is a few %, based on the entirety". Further, the film structure is insecure with respect to the mechanical strength, since it is composed of a pile of granules, as is evident from FIG. 15 of the publication. Besides, the vapor pressure of metallic silicon is low, and for its evaporation, a high temperature and heat resistant jig may, for example, be required, and there will be a problem such that the vapor deposition time is long, and the productivity is low.

On the other hand, applications of the SiO$_x$ film include, for example, a reflection-preventing film and a gas barrier film, in addition to the above-mentioned interlayer insulating film. Especially, a plastic having the gas barrier property improved by vapor deposition of an SiO$_x$ film, is convenient as a packaging material for pharmaceuticals, food products, etc., since the contents can easily be ascertained. However, on the other hand, the SiO$_x$ film has a brownish color tone, and it is desired to improve the color tone.

Accordingly, e.g. JP-A-8-197675 proposes a method of coating hydrogen peroxide to an SiO$_x$ vapor deposition film, and it is disclosed that the method is effective for improving oxygen and steam permeability. However, if hydrogen peroxide is employed, it is necessary to clean it subsequently, and it is difficult to completely remove it from e.g. semiconductor devices. Further, in the same publication, it is disclosed that the light transmittance and the oxygen permeability of an SiO film on a plastic film, were improved by irradiation with light, but such an effect is merely at a level of a few %.

In view of the above, it is an object of the present invention to provide a low relative permittivity SiO$_x$ film which is excellent in heat resistance without using an alkali metal, fluorine or the like and undergoes little change with time to SiO$_2$ and which is highly reliable as an interlayer insulating film for metal wirings, and a semiconductor device employing such a film.

Another object of the present invention is to provide an SiO$_x$ film having the relative permittivity further lowered and having the insulating property further improved by irradiating electromagnetic waves to the SiO$_x$ film to increase oxygen in the SiO$_x$ film.

DISCLOSURE OF THE INVENTION

Namely, the present invention is as follows:

A low relative permittivity SiO$_x$ film made of a porous material, the main constituent of the low relative permittivity SiO$_x$ film being SiO$_x$ (where $1.8 \geq x \geq 1.1$), and the relative permittivity at 1 MHz is at most 3.

The above-noted low relative permittivity SiO$_x$ film having a porosity from 20 to 60%, and a relative permittivity at 1 MHz that is at most 2.3.

The above-noted low relative permittivity SiO$_x$ film also having a relative permittivity index V, porosity P (%) and relative permittivity K that satisfy the formula 1:

$$V = K + 0.0286 \times P = 1.1 \text{ to } 3.5 \tag{1}$$

A cluster beam method for producing the above-noted low relative permittivity SiO$_x$ film in which SiO$_x$ gas is obtained by heating and evaporating an SiO$_x$ powder is deposited on a cooled substrate of at most −20° C.

A resistance heating method for producing the above-noted low relative permittivity SiO$_x$ film in which SiO$_x$ powder is vapor-deposited while adjusting the gas pressure of the vapor deposition atmosphere-controlling gas to be from 10 to 100 Pa.

The above-noted resistance heating method for producing the above-noted low relative permittivity $SiO_x$ film in which the vapor deposition atmosphere-controlling gas is at least one non-oxidizing gas selected from argon, helium and hydrogen.

The above-noted methods for producing the above-noted low relative permittivity $SiO_x$ film in which the specific surface area of the $SiO_x$ powder is at least 10 m²/g.

An electromagnetic wave method for modifying an $SiO_x$ film in which electromagnetic waves with a wavelength of at most 400 nm are irradiated to the $SiO_x$ film to increase the value x.

The above-noted electromagnetic wave method for modifying an $SiO_x$ film in which the $SiO_x$ film to which the electromagnetic waves are irradiated is the above-noted low relative permittivity $SiO_x$ film.

The above-noted electromagnetic wave method for modifying the above-noted low relative permittivity $SiO_x$ film in which the above-noted low relative permittivity $SiO_x$ film to which the electromagnetic waves are irradiated is one wherein the relative permittivity at 1 MHz is from 1.5 to 3.0, and the value x in $SiO_x$ is 0.5 <x<2.0.

The above-noted electromagnetic wave methods for modifying an $SiO_x$ film in which the dose of the electromagnetic waves is $0.1 \leq$ irradiation time (hours)×dose (W/cm²)$\leq 10$.

A semiconductor device in which the above-noted low relative permittivity $SiO_x$ film is used as an interlayer insulator for metal wirings.

Figure 1:
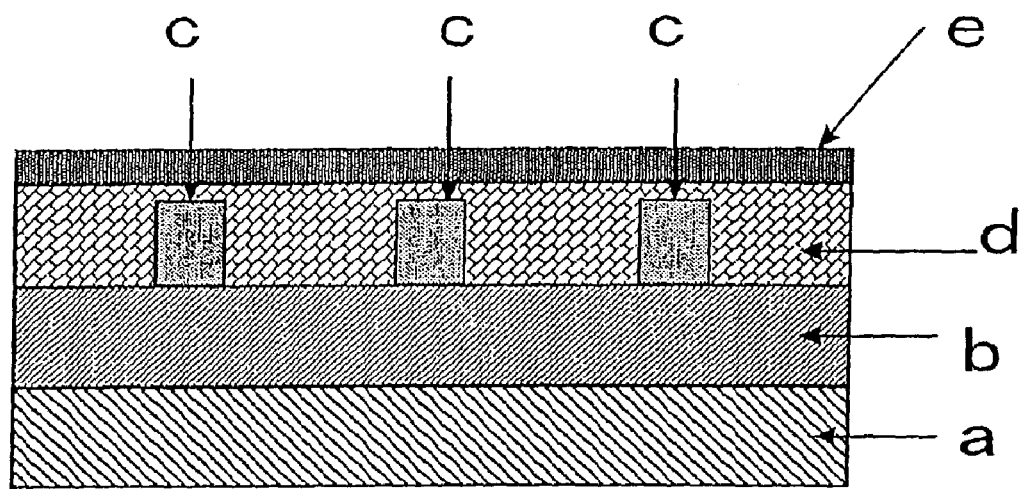
FIG. 1 is a schematic diagram showing the position for forming an interlayer insulating film of a semiconductor device.

MEANINGS OF SYMBOLS a: Silicon substrate
b: Silicon oxide film
c: Metal wiring
d: Interlayer insulating film
e: Silicon oxide film
1: Cooling tube
2: Substrate holder
3: Substrate
4: Gate valve
5: Shutter
6: Crucible
7: Filament
8: Exhaust vent
9: High voltage power source for electron impingement
10: Filament power source
11: Vacuum container

BEST MODE FOR CARRYING OUT THE INVENTION

The value x in the low relative permittivity $SiO_x$ film of the present invention is required to be $1.8 \geq x \geq 1.0$. The reason for this limitation is that as the value x is low i.e. is close to 1, gasification by heating tends to be easy, whereby the resulting film tends to be porous to facilitate lowering the relative permittivity of the film. If the value x is less than 1.0, metallic silicon tends to precipitate, whereby there tends to be a problem in the insulating property of the formed film. Further, if the value x exceeds 1.8, further reduction of the relative permittivity is possible, but the porosity deteriorates substantially, and the structure tends to be a granular structure, thus leading to a film having low mechanical strength. The value x is preferably $1.7 \geq x \geq 1.1$, more preferably $1.6 \geq x \geq 1.2$.

For the value x of the $SiO_x$ film, after peeling the formed film from the substrate, the molar amount of Si is measured in accordance with JIS R6124 (chemical analysis of silicon carbide polishing material) and the molar amount of oxygen is measured by means of an O/N simultaneous analyzing apparatus (such as "TC-136", manufactured by LECO Company), whereupon the value x can be calculated from the molar ratios.

It can be confirmed that $SiO_x$ is a silicon oxide of non-stoichiometrical compound and is not a mixture of Si and $SiO_2$, by carrying out the X-ray photoelectron spectroscopic analysis, whereby the position of bond energy of Si2P is found at a position different from that of Si or $SiO_2$. Specifically, Si2P bond energies of Si and $SiO_2$ are 99.1 eV and 103.6 eV, respectively, but a single peak of bond energy is found therebetween.

The low relative permittivity $SiO_x$ film of the present invention is preferably one whereby no metal component other than Si is detected by a fluorescent X-ray method. Unavoidable inclusion of impurities other than metal components, for example, solid solubilization of nitrogen or carbon, is permissible, and a film structure of e.g. $SiO_xNy$ or $SiO_xCy$, may be acceptable.

The $SiO_x$ film usually has a high value of the relative permittivity at a level of from 4 to 10. Accordingly, with a dense film, the relative permittivity can not be made to be at most 3 as in the present invention. Therefore, in the low relative permittivity $SiO_x$ film of the present invention, many fine voids (pores) are incorporated in the interior thereof to bring the relative permittivity to be at most 3.

If voids are merely increased to lower the relative permittivity, the film strength will also decrease to cause peeling, detachment, etc. of the interlayer insulating film, etc. Accordingly, the $SiO_x$ film of the present invention preferably has a structure wherein columnar $SiO_x$ are intertwined to form a network, so that fine voids are maintained among the columnar $SiO_x$. Such an $SiO_x$ film can be produced by the first or second process which will be described hereinafter.

Here, "columnar" is preferably such that a long diameter/short diameter ratio is at least 2, particularly at least 3. By such a structure in which columnar $SiO_x$ are intertwined to form a network, the porosity of the film can be made to be at least 20%, particularly at least 30%, without substantially impairing the mechanical strength, and it is possible to obtain an $SiO_x$ film free from peeling or crack. With a particularly preferred low relative permittivity $SiO_x$ film of the present invention, the porosity is from 20 to 60%, particularly from 30 to 55%, and the relative permittivity at 1 MHz is at most 3, particularly at most 2.3.

In the present invention, the porosity of the $SiO_x$ film is calculated by utilizing the electron density obtained from the critical angle of the total reflection by a total reflection X-ray method. Namely, it was obtained on the basis such that since the main component of the film is $SiO_x$, the electron density at the time when the film is dense, is the same as the value of thermally oxidized $SiO_2$, and the actually measured electron density of the film is one decreased by the presence of pores. The X-ray was one having CuKα-ray reflected by monochrometer Si(111).

Further, the low relative permittivity $SiO_x$ film is preferably such that the low permittivity index V obtained by the formula (1) is from 1.1 to 3.5, particularly from 1.3 to 3.5, further preferably from 2 to 3.5:

$$V = K + 0.0286 \times P \quad (1)$$

(where porosity: P(%) is the porosity, and K is the relative permittivity.)

The low relative permittivity index V represents the relation between the porosity and the relative permittivity of the $SiO_x$ film. The low relative permittivity index V being from 1.1 to 3.5, indicates that the relative permittivity is low despite the low porosity. If the value V exceeds 3.5, the strength of the $SiO_x$ film tends to be low, and the polishing resistance against e.g. CMP (Chemical Mechanical Polishing) tends to be poor. It is technically difficult to bring the value V to be less than 1.1. With a porous film of $SiO_2$, the value V is usually larger than 3.5. Particularly preferably, the value V is from 2.5 to 3.3.

The low relative permittivity $SiO_x$ film of the present invention can be produced by vapor deposition of an $SiO_x$ powder. As the vapor deposition method, a resistance heating method, a cluster beam method, a sputtering method or a laser beam irradiation method may be employed. In a cluster beam method, it is necessary to lower the atmospheric gas pressure and to lower the substrate temperature for deposition to be at most $-20°$ C. In a resistance heating method, a gas pressure and a substrate temperature which are higher than in the cluster beam method, are required. By a laser beam irradiation method, inclusion of impurities can be avoided, and the method is less susceptible to an influence of the atmospheric gas. In the present invention, a cluster beam method or a resistance heating method is particularly preferred. Especially, a low relative permittivity $SiO_x$ film having a relation of the above formula (1), can be easily produced by a resistance heating method.

A first production method of the present invention is a cluster beam method, which is a method wherein an $SiO_x$ gas obtained by putting an $SiO_x$ powder material into a vapor deposition crucible and heating and evaporating it, is deposited on a cooled substrate of at most $-20°$ C.

The $SiO_x$ powder material to be used in this production method, is produced by heating and evaporating a powder mixture comprising an $SiO_2$ powder and a silicon powder or a carbon powder to form an $SiO_x$ gas and introducing the gas into a cooling chamber, followed by cooling. The specific surface area (BET method) of the $SiO_x$ powder material is preferably at least 10 $m^2/g$, particularly preferably at least 50 $m^2/g$, whereby low temperature gasification and uniformity of the film can be facilitated. The $SiO_x$ powder material may contain unavoidable metal impurities, and nitrogen and carbon within a range not to adversely affect the insulating property or the relative permittivity.

The $SiO_x$ powder material may be put into an evaporation crucible as it is, or after molding it in a proper size. The latter is preferred, since formation of "hard spots" will be thereby very little in the produced $SiO_x$ film. If necessary, it may be sintered in a non-oxidizing atmosphere such as nitrogen, argon, helium, carbon monoxide or hydrogen at a temperature of from 500 to 1,250° C.

Figure 2:
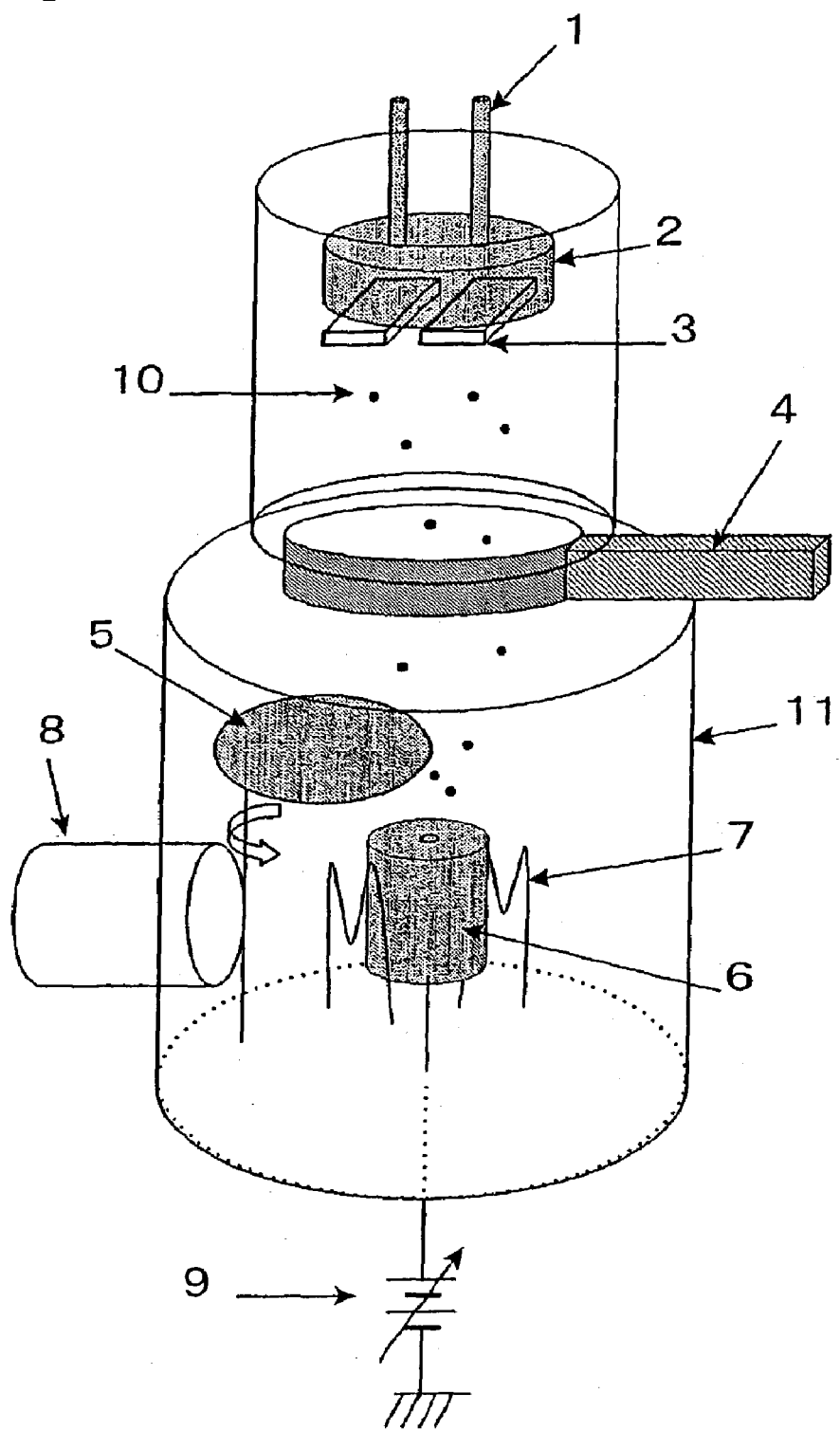
FIG. 2 is a conceptual diagram of a cluster beam vapor deposition apparatus.

A conceptual diagram of the cluster beam method is shown in FIG. 2. As is different from a vapor deposition method by resistance heating, the cluster beam method is a method wherein a cover having a small hole is put on the top of the vapor deposition crucible having the raw material filled, and the crucible is heated to gasify the raw material. The gasified raw material is discharged through the small hole of the cover as a jetting nozzle into the vacuum chamber, while forming clusters. The small hole size is usually at most 1 mm in diameter, whereby inside of the crucible becomes high pressure, and the clusters will be discharged at a high speed into the vacuum chamber. The speed is extremely high at a level of at least sonic speed.

In the cluster beam method, an $SiO_x$ powder material put in the vapor deposition crucible will form clusters, which are quenched by adiabatic expansion to deposit on a cooled substrate. The $SiO_x$ gas is a glassy substance having a relatively high viscosity, and formed clusters will be columnar and fly to stick into the cooled substrate, so that the formed film will have a porous film structure having columnar $SiO_x$ intertwined to form a network.

In the present invention, a reactive gas such as oxygen or nitrogen may positively be introduced into the chamber during the vapor deposition, whereby the ratio of Si:O in the $SiO_x$ gas in the chamber may be made to be different from the ratio in the starting material $SiO_x$ powder material, or the atmosphere may be made to be $SiO_xN_y$. Further, the size of clusters may be adjusted.

The type and the amount of the gas to be introduced into the chamber may suitably be determined depending upon the required properties of the film, but it is important to maintain a vacuuming condition of from $10^{-5}$ to $10^{-1}$ Pa. For example, when an $SiO_x$ powder having a value x of 1.2 is employed as the $SiO_x$ powder material, and nitrogen is introduced together with argon into the chamber at the time of the vapor deposition, it is possible to produce an $SiO_xN_y$ film in correspondence with the partial pressure of nitrogen gas. Introduction of nitrogen gas is advantageous for improvement of the insulating property, but it has a function to increase the relative permittivity, and accordingly, $y \leq 1.0$ is preferred.

In the present invention, the cooled substrate to be used for deposition of the vapor deposition film, is required to be cooled at least to a level of at most $-20°$ C., preferably at most $-50°$ C., more preferably at most $-100°$ C. The reason is such that even if cooled by adiabatic expansion, $SiO_x$ clusters flying towards the cooled substrate still have considerable heat and kinetic energies, and upon collision with the cooled substrate, such energies will be consumed by self diffusion. Namely, if the cooled substrate temperature is high, migration will result to form a dense film, which will be a film having a high relative permittivity. On the other hand, if the cooled substrate is sufficiently cooled, and such energies will be quickly recovered as heat, whereby migration will be prevented, and a porous film will be formed while the clusters will be maintained to be columnar, and it will be one having a low relative permittivity.

The temperature for heating the vapor deposition crucible is preferably from 800 to 1,500° C., particularly preferably from 900 to 1,200° C.

As described above, the cluster beam method employed for the first production method of the present invention is a method which is characterized in that vapor deposition is carried out while jetting a gasified raw material at a high speed at a level of a subsonic or supersonic speed, rather than whether or not clusters are in fact present in the gas. In the present invention, a means to increase kinetic energy by ionizing clusters, may also be adopted.

Now, a resistance heating method as the second production method of the present invention will be described.

For heating of the $SiO_x$ powder material, a vapor deposition boat made of a material such as conductive ceramics made of a composite sintered body of titanium boride and BN, ceramics such as PBN-coated carbon or a high melting point metal such as tungsten, is used. As the $SiO_x$ powder material, a material similar to the one described with respect to the first production method of the present invention, may be employed.

The heating temperature is preferably from 1,000 to 1,600° C., particularly preferably from 1,200 to 1,500° C. If the temperature is higher than 1,600° C., bumping takes place, and granular SiO is likely to form, and if the temperature is lower than 1,000° C., the evaporation speed of $SiO_x$ tends to be so slow that it takes too much time for formation of the film.

The feature of the second production method of the present invention is that an $SiO_x$ film is deposited on a substrate having a temperature higher than the above-mentioned cooled substrate, and vapor deposition is carried out by adjusting the gas pressure in the vapor deposition chamber to a level of from 10 to 1,000 Pa. As the vapor deposition atmosphere-controlling gas, at least one non-oxidizing gas selected from hydrogen, helium and argon, is preferably employed, but nitrogen, ammonia, etc. may suitably be further mixed. Argon gas is the most preferred gas from the viewpoint of the price, safety and vapor deposition stability. An oxidizing gas such as oxygen gas or $NO_2$ is minimized, but may be admissible in an amount such that the value x in the resulting $SiO_x$ will not exceed 1.8. The oxygen partial pressure is usually at most 0.1 Pa.

The temperature of the substrate to be used for deposition of the vapor deposition film is preferably from −10° C. to 500° C., particularly preferably from 100 to 400° C. If the temperature is lower than −10° C., the attachment of the film to the substrate tends to be weak, and if it is higher than 500° C., the adhesion will be good, but the relative permittivity will be high.

The low relative permittivity $SiO_x$ film having the relation of the above formula (1), particularly an $SiO_x$ film having a value x of from 2.5 to 3.3, can be easily realized by using argon gas as the vapor deposition atmosphere-controlling gas and by adjusting the gas pressure to be from 25 to 700 Pa and the substrate temperature to be from 10 to 400° C.

The low relative permittivity $SiO_x$ film of the present invention has applications as e.g. an interlayer insulating film of a semiconductor device, an anti-reflection film or a gas barrier film. The low relative permittivity $SiO_x$ film of the present invention is essentially inorganic and thus has characteristics that the heat conductivity is higher than a polymer insulating film of a silicon resin type or a polyimide type, the thermal expansion is low, and the heat resistance is excellent.

Now, a method for modifying an $SiO_x$ film of the present invention will be described.

The above-mentioned low relative permittivity $SiO_x$ film of the present invention has a porous structure, and its relative permittivity at 1 MHz is at most 3, preferably at most 2.3, but as it is, it is feared that a reagent solution or a corrosive gas may penetrate from the exterior environment in the process for producing semiconductors. Further, increasing the value x in $SiO_x$, is advantageous for the improvement of the insulating property. If such increase of the value x is to be carried out by the external heating in air, a high temperature heating of at least 700° C. will be required, which adversely affects the characteristics of semiconductor devices. Further, by oxidation by high temperature heating, sintering of $SiO_x$ takes place, and even if the relative permittivity of the material itself may decrease due to a decrease of fine voids, voids over the entire film will also decrease, whereby the relative permittivity may rather increase.

From such a viewpoint, an oxidation method in the vicinity of room temperature while maintaining the porous structure (a method for improving the insulation of $SiO_x$) has been studied, and as a result, it has been found that when electromagnetic waves with a wavelength of at most 400 nm are irradiated to the $SiO_x$ film having a relative permittivity of at most 3 at 1 MHz, preferably to the $SiO_x$ film having a relative permittivity of from 1.5 to 3.0 at 1 MHz and the value x in $SiO_x$ being 0.5<x<2.0, the value x will increase in a relatively short period of time, while the surface of $SiO_x$ will be densified, but other major portions will maintain the porous structure., It is thereby possible to preferably lower the relative permittivity and to improve the insulating property.

The electromagnetic waves to be irradiated, are preferably those containing waves with a wavelength of at most 400 nm as the main component, and a light corresponding to ultraviolet light or soft X-ray, is preferred. Electromagnetic waves exceeding 400 nm may be present as a subordinate component. However, with electromagnetic waves containing visible light, infrared light or the like with a wavelength exceeding 400 nm, as the main component, the $SiO_x$ surface will be densified, but the function to increase the value x to the interior, is poor.

The dose of the electromagnetic waves is such that the dose of light with a wavelength of at most 400 nm is a dose where the product of the irradiation time (hours) and the irradiation intensity ($W/cm^2$) obtainable by "Thermopile No. 17808" illumination meter manufactured by Epley Company, is from 0.1 to 10, preferably from 0.2 to 8, particularly preferably from 0.5 to 5. If such a dose is less than 0.1, the oxidation function is poor, and no adequate effect can be obtained. On the other hand, if it exceeds 10, a low relative permittivity $SiO_x$ film is likely to be peeled from the substrate.

The oxidation by the electromagnetic wave irradiation can be confirmed by measuring the Si2P bond energy by XPS. Further, the $SiO_x$ film will expand in the thickness direction by the electromagnetic wave irradiation, and by comparing the film thicknesses before and after the irradiation, it is possible to know the degree of oxidation carried out over the entire film.

EXAMPLES

Now, the present invention will be described in further detail with reference to Examples and Comparative Examples.

Examples 1 to 6 and Comparative Example 1 to 4

These Examples are Test Examples by the cluster beam method.

High purity metallic silicon powder and high purity silica powder (ultrafine powder) were mixed in equal mols and heated in a graphite vapor deposition crucible at a temperature of at least 1,800° C. by means of a high frequency furnace to generate $SiO_x$ gas, and the gas was led to a cooling chamber together with argon gas, whereby $SiO_x$ powder was recovered. The specific surface area of this $SiO_x$ powder by a BET method was 80 $m^2/g$, and the value x calculated from the analytical values of Si and oxygen, was 1.2.

By using this $SiO_x$ powder material and a cluster beam vapor deposition apparatus as shown in FIG. 2, $SiO_x$ films were formed under various conditions as identified in Table 1, on silicon single crystal substrates (cooled substrates). During the vapor deposition, a mixed gas of oxygen/argon of 1/99 vol %, was introduced, and its flow rate was changed to adjust the value x of the formed $SiO_x$ film. Further, the temperature of the cooled substrate was adjusted by supplying liquid nitrogen to the cooling tubes when it was set to be a very low temperature of −190° C., and by supplying a glycol cooling medium when it was set to be from −35 to 50° C.

With respect to the obtained $SiO_x$ films, the film thickness, the relative permittivity, the value x in $SiO_x$, and crack on the film surface and the state of peeling from the cooled substrate, were evaluated in accordance with the following methods. The results are shown in Table 1. Further, each $SiO_x$ film was porous.

(1) Film thickness: measured by means of a ST step meter manufactured by DEKTAK Company.

(2) Relative permittivity: using an element in such a form that the $SiO_x$ film was sandwiched between parallel flat plate electrodes, the capacity was measured by an LCZ meter, and the relative permittivity was calculated from the electrode surface area and the film thickness. The frequency was measured at 1 MHz.

(3) Value x in $SiO_x$: measured as described in the foregoing.

Further, with respect to the film of Example 2, the Si2P bond energy was measured by XPS (X-ray photoelectron spectrometry). The result was 102.4 eV. Although the bond energy when the value x was 1.0, was not measured, but assuming that it is 101.4 eV from the values of Si and $SiO_2$, the obtained 102.4 eV corresponds to x=1.5.

(4) Crack/peeling: the surface of the film was judged by the SEM photograph of 1,000 magnifications.

As is evident from Table 1, the low relative permittivity $SiO_x$ films of Examples had relative permittivities of not more than 3 and were free from crack or peeling.

Examples 7 to 13 and Comparative Example 5

These Examples are Test Examples by the resistance heating method.

The same $SiO_x$ powder material as used in the above Test Examples, was press-molded to obtain a pellet (5 mm in diameter×5 mm in height). The specific surface area of the pellet was 80 $m^2/g$, which was substantially the same as the specific surface area before the molding. Using this pellet and a resistance heating vapor deposition apparatus, $SiO_x$ films were formed under various conditions of the atmosphere-controlling gas and the substrate temperature, as identified in Table 2, on silicon single crystal substrates having a diameter of 2 inches.

Here, heating to make the substrate temperature higher than room temperature, was carried out by disposing an electric heater and a thermocouple behind the substrate.

The vapor deposition boat used for the vapor deposition, was a commercial product ("Denka BN composite EC", tradename, manufactured by Denki Kagaku Kogyo K.K.) made of a composite sintered body of boron nitride and titanium boride, and the vapor deposition was carreid out while controlling the temperature of the cavity portion within a range of from 1,325 to 1,380° C. by applying a voltage across both ends of the boat. The vapor deposition time was set to be 10 minutes. With respect to the obtained $SiO_x$ films, in addition to the above physical properties, the porosity was measured as described above. The results are shown in Table 2.

TABLE 1

| | Conditions for vapor deposition | | | | Film properties | | | | |
|---|---|---|---|---|---|---|---|---|---|
| | Vapor deposition temperature ° C. | Cooled substrate temperature ° C. | Vacuum degree Pa | Type of gas | Film thickness nm | Relative permittivity | Value x ($SiO_x$) | Crack | Peeling |
| Ex. 1 | 1,100 | −190 | $2 \times 10^{-5}$ | Nil | 312 | 2.3 | 1.2 | Nil | Nil |
| Ex. 2 | 1,100 | −190 | $2 \times 10^{-4}$ | $O_2$/Ar | 324 | 2.2 | 1.5 | Nil | Nil |
| Ex. 3 | 1,100 | −190 | $2 \times 10^{-3}$ | $O_2$/Ar | 332 | 2.2 | 1.6 | Nil | Nil |
| Ex. 4 | 1,100 | −190 | $2 \times 10^{-2}$ | $O_2$/Ar | 346 | 2.1 | 1.7 | Nil | Nil |
| Ex. 5 | 1,100 | −35 | $2 \times 10^{-5}$ | Nil | 280 | 2.6 | 1.2 | Nil | Nil |
| Ex. 6 | 1,100 | −15 | $2 \times 10^{-5}$ | Nil | 240 | 2.8 | 1.2 | Nil | Nil |
| Comp. Ex. 1 | 1,100 | −190 | $2 \times 10^{-1}$ | $O_2$/Ar | 357 | 1.9 | 1.9 | Small | Observed |
| Comp. Ex. 2 | 1,100 | −190 | $2 \times 10^{0}$ | $O_2$/Ar | 368 | 1.7 | 2.0 | Large | Observed |
| Comp. Ex. 3 | 1,100 | 20 | $2 \times 10^{-5}$ | Nil | 195 | 5.2 | 1.2 | Nil | Nil |
| Comp. Ex. 4 | 1,100 | 50 | $2 \times 10^{-5}$ | Nil | 195 | 5.2 | 1.2 | Nil | Nil |

TABLE 2

| | Atmosphere-controlling gas | | | Film properties | | | | | |
|---|---|---|---|---|---|---|---|---|---|
| | Vacuum degree Pa | Type of gas | Mixing ratio vol % | Substrate temperature °C. | Film thickness nm | Relative permittivity (k) | Porosity % | Value x K + 0.0286P | Crack | Peeling |
| Ex. 7 | 20 | Ar | 0 | 10 | 250 | 2.25 | 21.1 | 2.9 | Nil | Nil |
| Ex. 8 | 27 | Ar | 0 | 25 | 282 | 2.18 | 34.1 | 3.2 | Nil | Nil |
| Ex. 9 | 100 | Ar | 0 | 140 | 295 | 1.65 | 36.2 | 2.7 | Nil | Nil |
| Ex. 10 | 54 | Ar/H$_2$ | 50 | 250 | 312 | 1.78 | 38.9 | 3.3 | Nil | Nil |
| Ex. 11 | 54 | Ar/He | 50 | 250 | 335 | 1.72 | 40.5 | 2.9 | Nil | Nil |
| Ex. 12 | 70 | Ar | 0 | 250 | 343 | 1.58 | 52.1 | 3.1 | Nil | Nil |
| Ex. 13 | 200 | Ar | 0 | 300 | 358 | 1.41 | 59.4 | 3.1 | Nil | Nil |
| Comp. Ex. 5 | 5 | Ar | 0 | 500 | 236 | 3.2 | 22.2 | 3.8 | Nil | Nil |

As is evident from Table 2, the low relative permittivity SiO$_x$ films of Examples of the present invention had relative permittivities of not more than 2.3, porosities of from 20 to 60% and values V of from 2.5 to 3.3, and they were films free from crack or peeling.

Examples 14 to 20 and Reference Examples 1 and 2

These Examples are Test Examples relating to modification of an SiO$_x$ film.

As an SiO$_x$ powder material, one which had a specific surface area of 110 m$^2$/g as measured by a BET method and is substantially amorphous by the X-ray diffraction, whereby the value x in SiO$_x$ as calculated from the analysis of silicon and oxygen, was 1.05, was prepared. By the analysis of this SiO$_x$ powder material by fluorescent X-ray, metal impurities were 200 ppm of aluminum and 100 ppm of Fe, and the purity of SiO$_x$ was at least 99%. Further, the 2p bond energy of Si was measured by XPS as corrected and found to be 101.5 eV. By means of a mold press and CIP, this SiO$_x$ powder material was molded into a column of about 10 mm in diameter×10 mm in height. The specific surface area after the molding was 103 m$^2$/g, and thus, no substantial change in the specific surface area was observed between before and after the molding.

This pellet was put in the above-mentioned vapor deposition boat (Denka BN composite EC) and electricaly heated to carry out vacuum vapor deposition in a vacuum vapor deposition chamber at a temperature of 1,100° C. under a pressure of 800 Pa, thereby to deposit an SiO$_x$ film on a silicon substrate. Here, the vapor deposition temperature was measured by an infrared radiation thermometer. The pressure in the vapor deposition chamber was controlled by adjusting the flow rate of a mixed gas having an argon/oxygen ratio of 0.05 by adjusting the opening degrees of an exhaust gas gate and the gas inlet valve. The silicon substrate was held by a holder to which cooling water was circulated to avoid heating by vapor deposition.

After the vapor deposition for 10 minutes, the SiO$_x$ film was taken out together with the silicon substrate, and the film properties were measured. As a result, the film thickness was 350 nm, the value x in SiO$_x$ was 1.5, the relative permittivity was 2.3, and the insulation resistance was 0.8 nA. Further, the result of observation of the film structure was such that it was a porous structure free from crack or "hard spots" on the film surface.

Then, to the SiO$_x$ (value x: 1.5) film produced as described above, an ultraviolet ray of 400 nm or less (high pressure mercury lamp "USH-102D", manufactured by Ushio-sha was used) or a visible light (a commercially availabe incandescent lamp was used) was irradiated under the conditions as identified in Table 3. The irradiation intensity was controlled to be 0.25 W/cm$^2$, by adjusting the distance from the lamp by means of an irradiation meter.

With respect to the film before and after the irradiation, in addition to the above physical properties, the leak current was measured, and the influence by the irradiation was examined. The results are shown in Table 3. Further, the results of observation of the cross-section of the film by SEM showed that the film had a columnar structure extending vertically to the vapor deposition surface before and after the irradiation.

(6) Leak current: evaluated by a direct current electric resistance method by means of the same element as used for the measurement of the capacity. Firstly, the main electrode and the guard electrode were adjusted to the same potential, and a voltage is applied between the main electrode and the counter electrode. At that time, if only the leak current on the main electrode side is read, the measurement can be carried out in a state where there is no influence of the surface current. Parallel flat plate electrodes having an area of 0.03 cm$^2$ were contacted to the film (element), and a voltage of 20 V was applied, the leak current was not more than 1 nA in each case, and the film showed an adequate insulating property as an interlayer insulating film.

Reference Example 3

Vapor deposition of metallic silicon was carried out under such conditions that the temperature was 1,550° C., and the pressure of the gas having an argon/oxygen ratio of 0.1 was 20 Pa, to form an SiO$_x$ film having a thickness of 350 nm on a silicon single crystal substrate. This film had a value x of 0.9 and a relative permittivity of 8.8, and the result of the SEM observation showed a dense film.

To this SiO$_x$ film, an ultraviolet ray of 400 nm or less, was irradiated under the same condition as in Example 16. The results are shown in Table 3. On the film surface, crack was observed, and partial peeling was observed.

TABLE 3

| | Irradiation conditions | | | | Properties after irradiation | | | |
|---|---|---|---|---|---|---|---|---|
| | Light source | Irradiation intensity W/cm$^2$ | Irradiation time Hours | Dose (*1) | Value x SiO$_x$ | Relative permittivity | Leak current nA | Film thickness nm |
| Ex. 14 | Ultraviolet ray | 0.25 | 4 | 1 | 1.9 | 1.8 | 0.4 | 450 |
| Ex. 15 | Ultraviolet ray | 0.25 | 0.2 | 0.05 | 1.5 | 2.0 | 0.7 | 380 |
| Ex. 16 | Ultraviolet ray | 0.25 | 1 | 0.25 | 1.6 | 1.9 | 0.6 | 350 |
| Ex. 17 | Ultraviolet ray | 0.25 | 2 | 0.5 | 1.7 | 1.8 | 0.6 | 400 |
| Ex. 18 | Ultraviolet ray | 0.25 | 10 | 2.5 | 2.0 | 1.7 | 0.4 | 460 |
| Ex. 19 | Ultraviolet ray | 0.25 | 30 | 7.5 | 2.0 | 1.6 | 0.4 | 460 |
| Ex. 20 | Ultraviolet ray | 0.25 | 60 | 15 | 2.0 | 1.7 | 0.5 | 460 |
| Ref. Ex. 1 | White light | 0.25 | 4 | 1 | 1.5 | 2.3 | 0.8 | 350 |
| Ref. Ex. 2 | White light | 0.25 | 30 | 7.5 | 1.6 | 2.3 | 0.8 | 360 |
| Ref. Ex. 3 | Ultraviolet ray | 0.25 | 1 | 0.25 | 1.2 | 7.8 | 1.2 | 370 |

As is evident from Table 3, the low relative permittivity SiO$_x$ films modified in Examples had relative permittivities of not more than 2.0 and high insulating property (small leak current) and were free from cracks or peeling.

INDUSTRIAL APPLICABILITY

According to the present invention, a low relative permittivity SiO$_x$ film excellent in heat resistance will be presented without using an alkali metal, fluorine, etc. Further, according to the method for modifying an SiO$_x$ film of the present invention, further reduction of the relative permittivity can be accomplished for the low relative permittivity SiO$_x$ film, and the insulating property will also increase. If the low relative permittivity SiO$_x$ film of the present invention is used as an interlayer insulating film for metal wirings, a semiconductor device having a high reliability free from crack or peeling of the film, will be presented.

The invention claimed is:

1. A film including SiO$_x$ as a main component, with SiO$_x$ being present in the film in a proportional quantity greater than any other proportional quantity of any other component present in the film, where $1.8 \geq x \geq 1.1$, and the film has a relative permittivity not greater than 3 at 1 MHz.

2. The film according to claim 1, wherein the film has a porosity from 20 to 60%, and the relative permittivity at 1 MHz is at most 2.3.

3. The film according to claim 2, wherein a relative permittivity index V, the porosity P (%) and the relative permittivity K satisfy the formula:

$$V = K + 0.0286 \times P = 1.1 \text{ to } 3.5.$$

4. A semiconductor device, wherein the film defined in claim 1 is used as an interlayer insulator for metal wirings.

5. A semiconductor device, wherein the film defined in claim 2 is used as an interlayer insulator for metal wirings.

6. A semiconductor device, wherein the film defined in claim 3 is used as an interlayer insulator for metal wirings.

* * * * *